US012635591B2

(12) United States Patent
Lee et al.

(10) Patent No.: US 12,635,591 B2
(45) Date of Patent: May 19, 2026

(54) SEMICONDUCTOR PACKAGE

(71) Applicant: SAMSUNG ELECTRONICS CO., LTD., Suwon-si (KR)

(72) Inventors: Jae-Ean Lee, Suwon-si (KR); Gyu Jin Choi, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 705 days.

(21) Appl. No.: 17/836,711

(22) Filed: Jun. 9, 2022

(65) Prior Publication Data

US 2023/0134541 A1 May 4, 2023

(30) Foreign Application Priority Data

Nov. 1, 2021 (KR) ........................ 10-2021-0148075

(51) Int. Cl.
H01L 23/498 (2006.01)
H01L 23/31 (2006.01)
(Continued)

(52) U.S. Cl.
CPC .... H01L 23/49811 (2013.01); H01L 23/3128 (2013.01); H01L 23/49816 (2013.01);
(Continued)

(58) Field of Classification Search
CPC . H01L 23/498–49894; H01L 23/49811; H01L 23/3128; H01L 23/49816;
(Continued)

(56) References Cited

U.S. PATENT DOCUMENTS 9,412,714 B2 8/2016 Co et al.
9,984,960 B2 5/2018 Hwang et al.
(Continued)

FOREIGN PATENT DOCUMENTS

KR 1020010093184 A 10/2001
KR 1020080020069 A 3/2008
KR 10-2017-0058680 A 5/2017

OTHER PUBLICATIONS

Communication issued on Jul. 2, 2025 by the Korean Intellectual Property Office in Korean Patent Application No. 10-2021-0148075.

*Primary Examiner* — Steven B Gauthier
*Assistant Examiner* — Rhys Poniente Sheker
(74) *Attorney, Agent, or Firm* — Sughrue Mion, PLLC

(57) ABSTRACT

A semiconductor package is provided. The semiconductor package includes: a substrate; a first semiconductor chip provided on an upper surface of the substrate; an interposer provided on the first semiconductor chip; a conductive pad provided on the upper surface of the substrate; and a connecting portion provided between the upper surface of the substrate and a lower surface of the interposer, wherein the connecting portion is spaced apart from the first semiconductor chip along a horizontal direction parallel to the upper surface of the substrate, and electrically connects the conductive pad and the interposer, and the connecting portion includes a first metal layer provided on the conductive pad, a second metal layer provided on the first metal layer, and a metal post provided on the second metal layer, wherein the first metal layer includes a first metal, the second metal layer includes a second metal different from the first metal, and the metal post includes a third metal different from the first metal and the second metal.

13 Claims, 21 Drawing Sheets

(51) Int. Cl.
H01L 25/18 (2023.01)
*H01L 23/00* (2006.01)

(52) U.S. Cl.
CPC .............. *H01L 25/18* (2013.01); *H01L 24/05*
(2013.01); *H01L 24/13* (2013.01); *H01L 24/16*
(2013.01); *H01L 24/29* (2013.01); *H01L 24/32*
(2013.01); *H01L 2224/05599* (2013.01); *H01L*
*2224/13109* (2013.01); *H01L 2224/13111*
(2013.01); *H01L 2224/13113* (2013.01); *H01L*
*2224/13116* (2013.01); *H01L 2224/13118*
(2013.01); *H01L 2224/1312* (2013.01); *H01L*
*2224/13139* (2013.01); *H01L 2224/13144*
(2013.01); *H01L 2224/13147* (2013.01); *H01L*
*2224/13155* (2013.01); *H01L 2224/16227*
(2013.01); *H01L 2224/29099* (2013.01); *H01L*
*2224/32225* (2013.01); *H01L 2924/014*
(2013.01)

(58) Field of Classification Search
CPC ........... H01L 23/49827; H01L 23/5389; H01L
23/49833; H01L 25/03–0756; H01L
24/05; H01L 24/13; H01L 24/29; H01L
24/32; H01L 2224/05599; H01L
2224/13109; H01L 2224/13111; H01L
2224/13113; H01L 2224/13116; H01L
2224/13118; H01L 2224/1312; H01L
2224/13139
See application file for complete search history.

(56) References Cited

U.S. PATENT DOCUMENTS

| | | | |
|---|---|---|---|
| 10,304,697 | B2 | 5/2019 | Balaraman et al. |
| 10,593,643 | B2 | 3/2020 | Sato et al. |
| 10,679,866 | B2 | 6/2020 | Hwang et al. |
| 10,756,049 | B2 | 8/2020 | Chau et al. |
| 2008/0054458 | A1 | 3/2008 | Ozaki |
| 2017/0317017 | A1* | 11/2017 | Ishihara ............ H01L 23/49827 |
| 2018/0047693 | A1* | 2/2018 | Raravikar ............... H01L 25/50 |
| 2018/0277394 | A1* | 9/2018 | Huemoeller .......... H01L 21/565 |
| 2019/0131284 | A1 | 5/2019 | Jeng et al. |
| 2022/0367327 | A1* | 11/2022 | Kang ................ H01L 23/49811 |
| 2022/0367366 | A1* | 11/2022 | Hou ......................... H01L 25/18 |
| 2024/0096808 | A1* | 3/2024 | Kudo ...................... H01L 24/16 |
| 2024/0290710 | A1* | 8/2024 | Nam ................... H01L 23/3128 |

* cited by examiner

SEMICONDUCTOR PACKAGE

CROSS-REFERENCE TO RELATED APPLICATION

This application claims priority from Korean Patent Application No. 10-2021-0148075 filed on Nov. 1, 2021 in the Korean Intellectual Property Office, the disclosure of which is incorporated by reference herein in its entirety.

BACKGROUND

1. Field

The present disclosure relates to a semiconductor package.

2. Related Art

To implement high-performance elements, semiconductor chips have increased in size, and therefore semiconductor packages have also increased in size. On the other hand, the thickness of the semiconductor package has decreased to provide a lower profile electronic device.

Semiconductor packages are being developed to satisfy the demands for multi-functionality, high capacity, and miniaturization. By incorporating a plurality of semiconductor chips into a single semiconductor package, it has become possible to provide increased capacity and increased functionality, while significantly reducing the size of the semiconductor package.

SUMMARY

Aspects of the present disclosure provide a semiconductor package in which a connecting portion, which provides an electrical connection (i.e., a direct electrical connection) between a substrate and an interposer, includes a first metal layer including a metal having a relatively low melting point, a second metal layer including a metal for preventing diffusion of other metals, and a metal post, and thus, the connecting portion is effectively attached onto the substrate.

According to an aspect of an example embodiment, a semiconductor package includes: a substrate; a first semiconductor chip provided on an upper surface of the substrate; an interposer provided on the first semiconductor chip; a conductive pad provided on the upper surface of the substrate; and a connecting portion provided between the upper surface of the substrate and a lower surface of the interposer, wherein the connecting portion is spaced apart from the first semiconductor chip along a horizontal direction parallel to the upper surface of the substrate, and electrically connects the conductive pad and the interposer, and the connecting portion includes a first metal layer provided on the conductive pad, a second metal layer provided on the first metal layer, and a metal post provided on the second metal layer, wherein the first metal layer includes a first metal, the second metal layer includes a second metal different from the first metal, and the metal post includes a third metal different from the first metal and the second metal.

According to an aspect of an example embodiment, a semiconductor package includes: a substrate; a first semiconductor chip provided on an upper surface of the substrate; an interposer provided on the first semiconductor chip; a conductive pad provided on the upper surface of the substrate; and a connecting portion provided between the upper surface of the substrate and a lower surface of the interposer, wherein the connecting portion is spaced apart from the first semiconductor chip along a horizontal direction parallel to the upper surface of the substrate and electrically connects the conductive pad and the interposer, and the connecting portion includes a metal post that extends in a vertical direction perpendicular to the upper surface of the substrate and a first metal layer that surrounds a surface of the metal post, wherein the first metal layer includes a first metal and the metal post includes a second metal that is different from the first metal.

According to an aspect of an example embodiment, a semiconductor package including: a substrate; a first semiconductor chip provided on an upper surface of the substrate; a conductive pad provided on the upper surface of the substrate; a first metal layer provided on an upper surface of the conductive pad and including tin (Sn); a second metal layer provided on an upper surface of the first metal layer and including nickel (Ni); a metal post provided on an upper surface of the second metal layer, wherein the metal post extends in a vertical direction perpendicular to the upper surface of the substrate, includes copper (Cu), and has an upper surface farther from the upper surface of the substrate than an upper surface of the first semiconductor chip; and a mold layer which surrounds side walls of each of the first metal layer, the second metal layer and the metal post, and side walls and the upper surface of the first semiconductor chip, wherein an upper surface of the mold layer and the upper surface of the metal post extend along a common plane.

Aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects will become more apparent from the following description of example embodiments taken in conjunction with the attached drawings, in which:

FIG. 12 is an enlarged view of a region R2 of FIG. 11;

FIG. 14 is an enlarged view of a region R3 of FIG. 13;

FIG. 18 is an enlarged view of a region R5 of FIG. 17;

FIG. 20 is an enlarged view of a region R6 of FIG. 19;

FIG. 22 is an enlarged view of a region R7 of FIG. 21;

DETAILED DESCRIPTION

Figure 1:
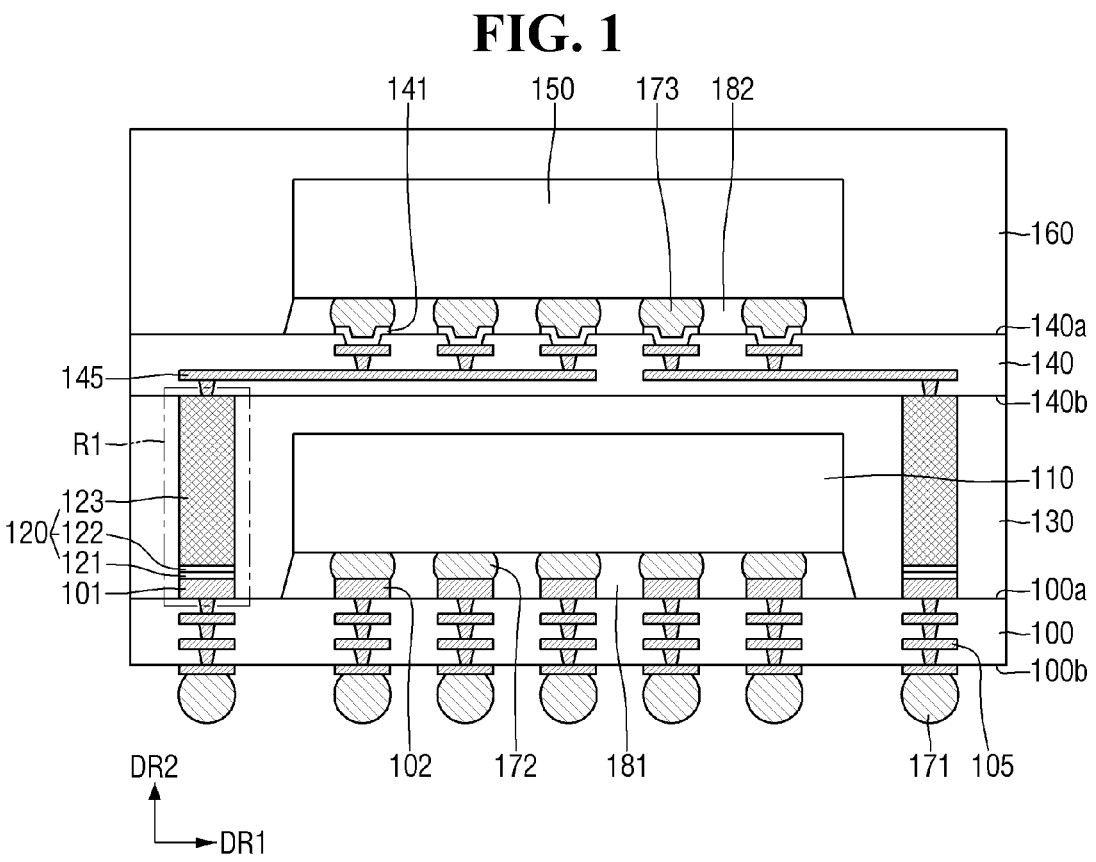
FIG. 1 is a diagram for explaining a semiconductor package according to some example embodiments.

Hereinafter, example embodiments will be described in detail with reference to the accompanying drawings. Like components are denoted by like reference numerals throughout the specification, and repeated descriptions thereof are omitted. Each example embodiment is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
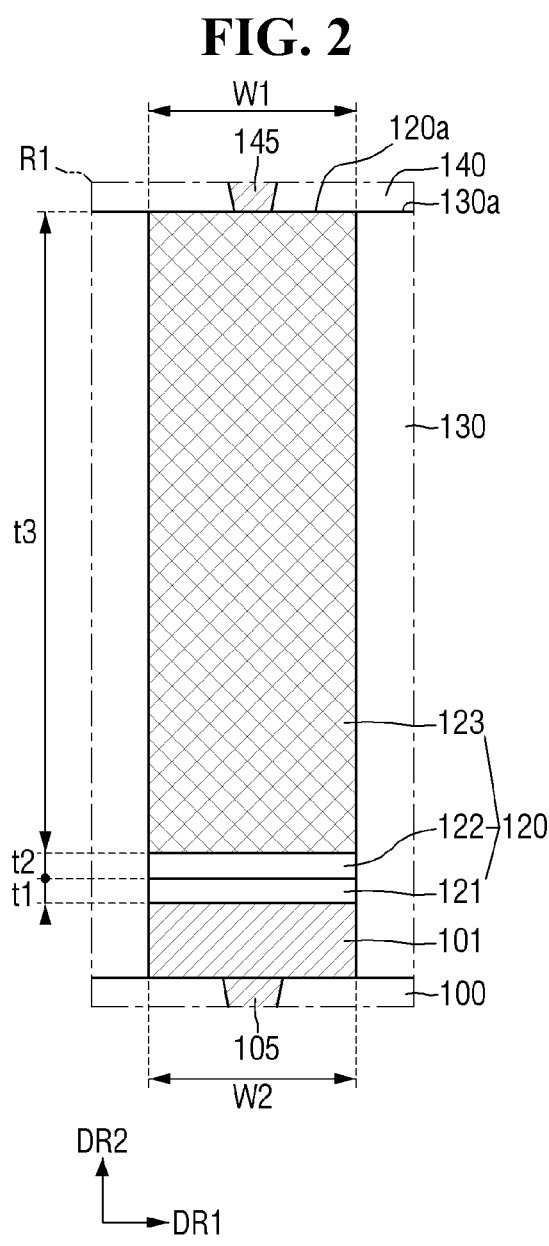
FIG. 2 is an enlarged view of a region R1 of FIG. 1.

FIG. 1 is a diagram for explaining a semiconductor package according to some example embodiments. FIG. 2 is an enlarged view of a region R1 of FIG. 1.

Referring to FIGS. 1 and 2, the semiconductor package according to some example embodiments includes a substrate 100, a first wiring pattern 105, a first conductive pad 101, a second conductive pad 102, a first semiconductor chip 110, a connecting portion 120, a first mold layer 130, an interposer 140, a conductive terminal 141, a second wiring pattern 145, a second semiconductor chip 150, a second mold layer 160, first to third solder balls 171, 172 and 173, a first underfill material 181, and a second underfill material 182.

The substrate 100 may be, for example, a printed circuit substrate (PCB) or a ceramic substrate. However, example embodiments are not limited thereto.

When the substrate 100 is a printed circuit substrate, the substrate 100 may be made of at least one material selected from phenol resin, epoxy resin, and polyimide. For example, the substrate 100 may include at least one material selected from FR4, tetrafunctional epoxy, polyphenylene ether, epoxy/polyphenylene oxide, BT (bismaleimide triazine), thermount, cyanate ester, polyimide, and liquid crystal polymer.

The first wiring pattern 105 may be disposed inside the substrate 100. For example, at least a part of the first wiring pattern 105 may be disposed on the lower surface 100$b$ of the substrate 100. The first wiring pattern 105 may include a plurality of wirings spaced apart from each other along a horizontal direction DR1. Further, the first wiring pattern 105 may include a plurality of wirings spaced apart from each other along a vertical direction DR2 that is perpendicular to the horizontal direction DR1. The first wiring pattern 105 may include a conductive material.

The first solder ball 171 may be disposed on a lower surface 100$b$ of the substrate 100. The first solder ball 171 may be in contact with the first wiring pattern 105 disposed on the lower surface 100$b$ of the substrate 100. The first solder ball 171 may protrude convexly from the lower surface 100$b$ of the substrate 100. The first solder ball 171 may be a portion by which the substrate 100 is electrically connected to another external element.

Although the first solder ball 171 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, example embodiments are not limited thereto.

The first conductive pad 101 may be disposed on an upper surface 100$a$ of the substrate 100. For example, the first conductive pad 101 may be disposed on an edge portion of the upper surface 100$a$ of the substrate 100. The first conductive pad 101 may be directly and electrically connected to the first wiring pattern 105. The first conductive pad 101 may include a conductive material.

The second conductive pad 102 may be disposed on the upper surface 100$a$ of the substrate 100. For example, the second conductive pad 102 may be disposed on a central portion of the upper surface 100$a$ of the substrate 100. The second conductive pad 102 may be spaced apart from the first conductive pad 101 along the horizontal direction DR1. The second conductive pad 102 may be directly and electrically connected to the first wiring pattern 105. The second conductive pad 102 may include a conductive material.

The first semiconductor chip 110 may be disposed on the upper surface 100$a$ of the substrate 100. The first semiconductor chip 110 may be disposed on the second conductive pad 102. The first semiconductor chip 110 may be, for example, a logic semiconductor chip. The first semiconductor chip 110 may be a micro-processor. The first semiconductor chip 110 may be, for example, a central processing unit (CPU), a controller, an application specific integrated circuit (ASIC) or the like.

The second solder ball 172 may be disposed between the upper surface 100$a$ of the substrate 100 and the first semiconductor chip 110. The second solder ball 172 may be disposed between the second conductive pad 102 and the first semiconductor chip 110. The first semiconductor chip 110 may be electrically connected to the second conductive pad 102 through the second solder ball 172. The first semiconductor chip 110 may be electrically connected to the first wiring pattern 105 through the second solder ball 172 and the second conductive pad 102.

Although the second solder ball 172 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, example embodiments are not limited thereto.

The first underfill material 181 may surround side walls of each of the second conductive pad 102 and the second solder ball 172 between the upper surface 100$a$ of the substrate 100 and the first semiconductor chip 110. Although the first underfill material 181 may be formed to further protrude laterally from the side walls of the first semiconductor chip 110, example embodiments are not limited thereto.

The interposer 140 may be disposed on the upper surface of the first semiconductor chip 110. For example, the interposer 140 may be spaced apart from the first semiconductor chip 110 along the vertical direction DR2. The interposer 140 may include silicon. In some other example embodiments, the interposer 140 may include, for example, at least one of glass, ceramic, or plastic. In yet some other example embodiments, the interposer 140 may perform the function of the redistribution layer. In this case, the interposer 140 may be made of at least one material selected from phenolic resin, epoxy resin and polyimide.

The second wiring pattern 145 may be disposed inside the interposer 140. The second wiring pattern 145 may include a plurality of wirings spaced apart from each other along the horizontal direction DR1. Further, the second wiring pattern 145 may include a plurality of wirings spaced apart from each other along the vertical direction DR2. The second wiring pattern 145 may include a conductive material.

The connecting portion 120 may be disposed between the upper surface 100*a* of the substrate 100 and a lower surface 140*b* of the interposer 140. The connecting portion 120 may be spaced apart from the first semiconductor chip 110 along the horizontal direction DR1. The connecting portion 120 may be disposed on the first conductive pad 101. The connecting portion 120 may be in contact with each of the first conductive pad 101 and the second wiring pattern 145. The interposer 140 may be electrically connected to the first conductive pad 101 through the connecting portion 120.

For example, a width W1 of the connecting portion 120 in the horizontal direction DR1 may be equal to a width W2 of the first conductive pad 101 in the horizontal direction DR1. For example, both side walls in the horizontal direction DR1 of the connecting portion 120 may be aligned with both side walls in the horizontal direction DR1 of the first conductive pad 101 in the vertical direction DR2. However, example embodiments are not limited thereto.

The connecting portion 120 may include a first metal layer 121, a second metal layer 122, and a metal post 123. The first metal layer 121 may be in contact with the first conductive pad 101. For example, an upper surface of the first metal layer 121 may be formed to be closer to the substrate 100 than an upper surface of the first semiconductor chip 110. The first metal layer 121 may include metal. The first metal layer 121 may include, for example, tin (Sn). For example, when the first metal layer 121 includes tin (Sn), the melting point may be relatively low at 232° C. As a result, the first metal layer 121 may be relatively easily brought into contact with the first conductive pad 101.

The second metal layer 122 may be in contact with the first metal layer 121 on the upper surface of the first metal layer 121. For example, the upper surface of the second metal layer 122 may be formed to be closer to the substrate 100 than the upper surface of the first semiconductor chip 110. The second metal layer 122 may include metal. The second metal layer 122 may include a metal different from that of the first metal layer 121. The second metal layer 122 may include, for example, nickel (Ni). For example, when the first metal layer 121 includes nickel (Ni), metal included in the metal post 123 may be prevented from diffusing into the first metal layer 121 and the first conductive pad 101.

The metal post 123 may be in contact with the second metal layer 122 on the second metal layer 122. The metal post 123 may extend in the vertical direction DR2. For example, the upper surface of the metal post 123 may be formed to be farther from the substrate 100 than the upper surface of the first semiconductor chip 110. The metal post 123 may include metal. The metal post 123 may include a metal different from those of each of the first metal layer 121 and the second metal layer 122. The metal post 123 may include, for example, copper (Cu). In some other example embodiments, the metal post 123 may include at least one of silver (Ag) and gold (Au).

For example, the width W1 in the horizontal direction DR1 of each of the first metal layer 121, the second metal layer 122, and the metal post 123 may be equal to each other. For example, the width W1 in the horizontal direction DR1 of each of the first metal layer 121, the second metal layer 122, and the metal post 123 may be the same as the width W2 of the first conductive pad 101 in the horizontal direction DR1. However, example embodiments are not limited thereto.

For example, a thickness t3 of the metal post 123 in the vertical direction DR2 may be greater than a thickness t1 of the first metal layer 121 in the vertical direction DR2. For example, the thickness t3 of the metal post 123 in the vertical direction DR2 may be greater than the thickness t2 of the second metal layer 122 in the vertical direction DR2. For example, the thickness t3 of the metal post 123 in the vertical direction DR2 may be greater than the sum of the thickness t1 of the first metal layer 121 in the vertical direction DR2 and the thickness t2 of the second metal layer 122 in the vertical direction DR2. However, example embodiments are not limited thereto.

The first mold layer 130 may be disposed on the upper surface 100*a* of the substrate 100. The first mold layer 130 may surround each of the side walls and the upper surface of the first semiconductor chip 110, the side walls of the first underfill material 181, the side walls of the first conductive pad 101, and the side walls of the connecting portion 120. The upper surface 130*a* of the first mold layer 130 may be formed on the same plane as the upper surface 120*a* of the connecting portion 120. That is, the upper surface 130*a* of the first mold layer 130 may be formed on the same plane as the upper surface of the metal post 123. The first mold layer 130 may include, for example, an epoxy molding compound (EMC) or two or more types of silicone hybrid materials. However, example embodiments are not limited thereto.

The conductive terminal 141 may be disposed on the upper surface 140*a* of the interposer 140. For example, the conductive terminal 141 may be disposed along the side walls and a bottom surface of a recess formed on the upper surface 140*a* of the interposer 140. At least a part of the conductive terminal 141 may be disposed on the upper surface 140*a* of the interposer 140 adjacent to the recess. The conductive terminal 141 may include a conductive material.

The second semiconductor chip 150 may be disposed on the upper surface 140*a* of the interposer 140. The second semiconductor chip 150 may be disposed on the conductive terminal 141. The second semiconductor chip 150 may be, for example, a High Bandwidth Memory (HBM) semiconductor chip. For example, the second semiconductor chip 150 may include a plurality of stacked memory semiconductor chips. Each of the plurality of memory semiconductor chips may be, for example, a volatile memory semiconductor chip such as a Dynamic Random Access Memory (DRAM) or a Static Random Access Memory (SRAM), or a non-volatile memory semiconductor chip such as a Phase-change Random Access Memory (PRAM), a Magnetoresistive Random Access Memory (MRAM), a Ferroelectric Random Access Memory (FeRAM) or a Resistive Random Access Memory (RRAM). However, example embodiments are not limited thereto.

A third solder ball 173 may be disposed between the upper surface 140*a* of the interposer 140 and the second semiconductor chip 150. The third solder ball 173 may be in contact with the conductive terminal 141 on the conductive terminal 141. The second semiconductor chip 150 may be electrically connected to the conductive terminal 141 through the third solder ball 173. The second semiconductor chip 150 may be electrically connected to the interposer 140 through the third solder ball 173 and the conductive terminal 141.

Although the third solder ball 173 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, example embodiments are not limited thereto.

The second underfill material 182 may surround the side walls of each of the conductive terminal 141 and the third solder ball 173 between the upper surface 140a of the interposer 140 and the second semiconductor chip 150. Although the second underfill material 182 may be formed to further protrude laterally from the side walls of the second semiconductor chip 150, example embodiments are not limited thereto.

The second mold layer 160 may be disposed on the upper surface 140a of the interposer 140. The second mold layer 160 may surround each of the side walls and the upper surface of the second semiconductor chip 150, and the side walls of the first underfill material 181. However, example embodiments are not limited thereto. In some other example embodiments, the upper surface of the second mold layer 160 may be formed on the same plane as the upper surface of the second semiconductor chip 150. The second mold layer 160 may include, for example, an epoxy molding compound (EMC) or two or more types of silicone hybrid materials. However, example embodiments are not limited thereto.

Hereinafter, a method for fabricating a semiconductor package according to some example embodiments will be described referring to FIGS. 1 to 10.

FIGS. 3 to 10 are intermediate process diagrams for explaining the method for fabricating the semiconductor package according to some example embodiments.

Figure 3:
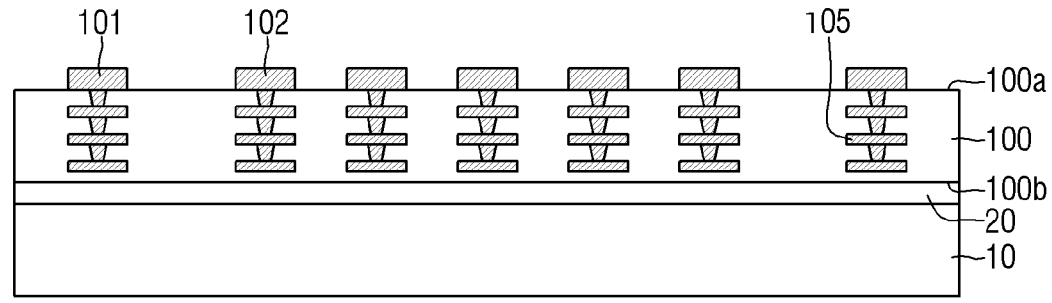
FIGS. 3 to 10 are intermediate process diagrams for explaining a method for fabricating a semiconductor package according to some example embodiments.

Referring to FIG. 3, a release layer 20 may be formed on the carrier substrate 10. The carrier substrate 10 may include, for example, silicon, metal, glass, plastic, ceramic, or the like, but example embodiments are not limited thereto.

The release layer 20 may be formed on the upper surface of the carrier substrate 10. For example, the release layer 20 may be conformally formed. The release layer 20 may include, for example, epoxy or polyimide. However, example embodiments are not limited thereto. In some other example embodiments, the release layer 20 may be an inorganic release layer to introduce stable detectable properties. In this case, the release layer 20 may be made of, for example, a carbon material, but example embodiments are not limited thereto.

The substrate 100 may be formed on the release layer 20. The first wiring pattern 105 may be formed inside the substrate 100. The first conductive pad 101 and the second conductive pad 102 may be formed on the upper surface 100a of the substrate 100.

Figure 4:
Figure 4:
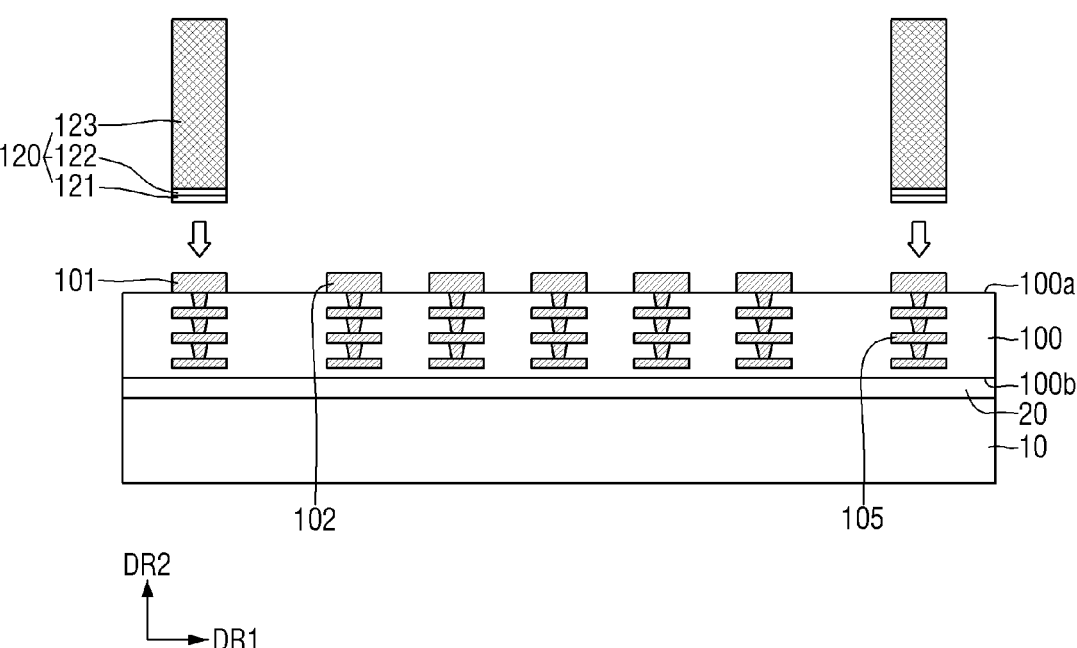
Figure 5:
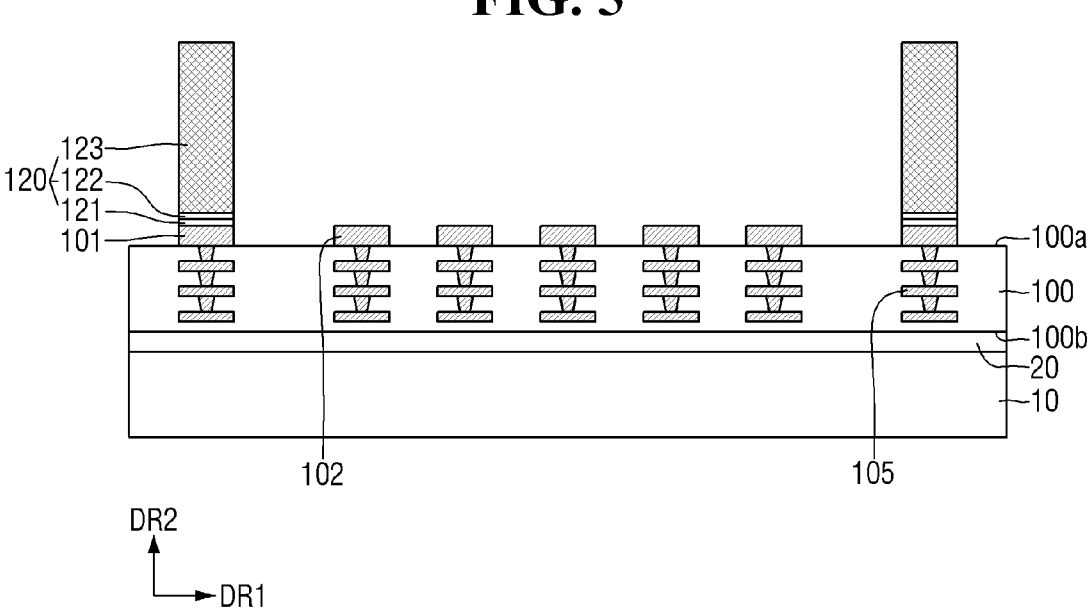

Referring to FIGS. 4 and 5, the connecting portion 120 may be formed. The connecting portion 120 may include a first metal layer 121, a second metal layer 122, and a metal post 123 which are sequentially stacked in the vertical direction DR2. The connecting portion 120 may be attached onto the upper surface of the first conductive pad 101. Specifically, a lower surface of the first metal layer 121 may be attached onto the upper surface of the first conductive pad 101. Since the first metal layer 121 includes a metal having a relatively low melting point, the first metal layer 121 may be easily attached to the first conductive pad 101.

Figure 6:
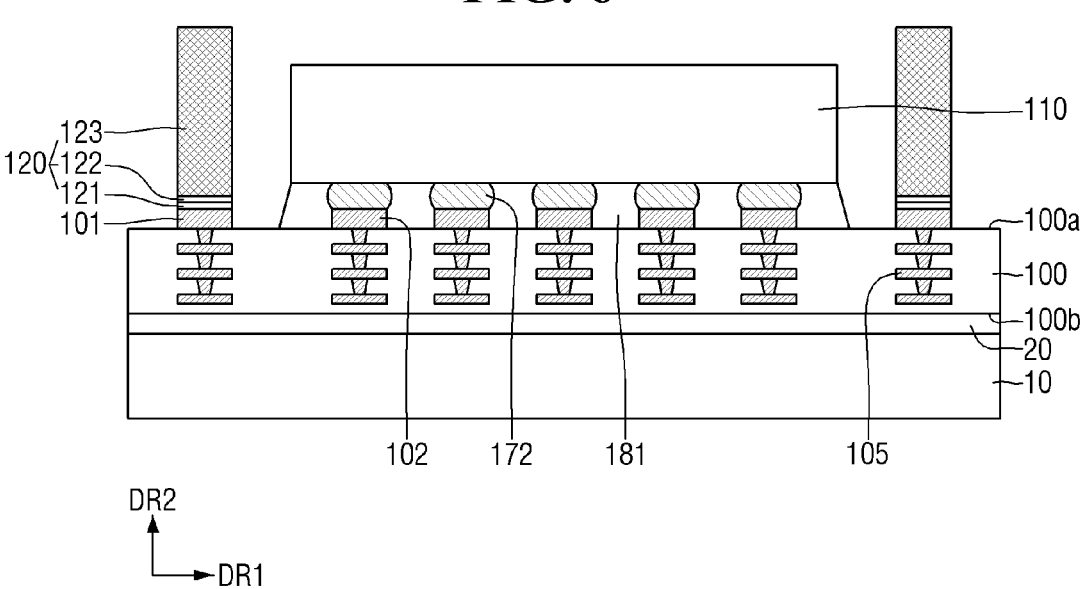

Referring to FIG. 6, the first semiconductor chip 110 may be formed on the upper surface 100a of the substrate 100. The first semiconductor chip 110 may be spaced apart from the connecting portion 120 along the horizontal direction DR1. The first semiconductor chip 110 may be attached to the second conductive pad 102 through the second solder ball 172. The first underfill material 181 may be formed between the upper surface 100a of the substrate 100 and the first semiconductor chip 110 to surround each of the side walls of the second solder ball 172 and the side walls of the second conductive pad 102.

Figure 7:
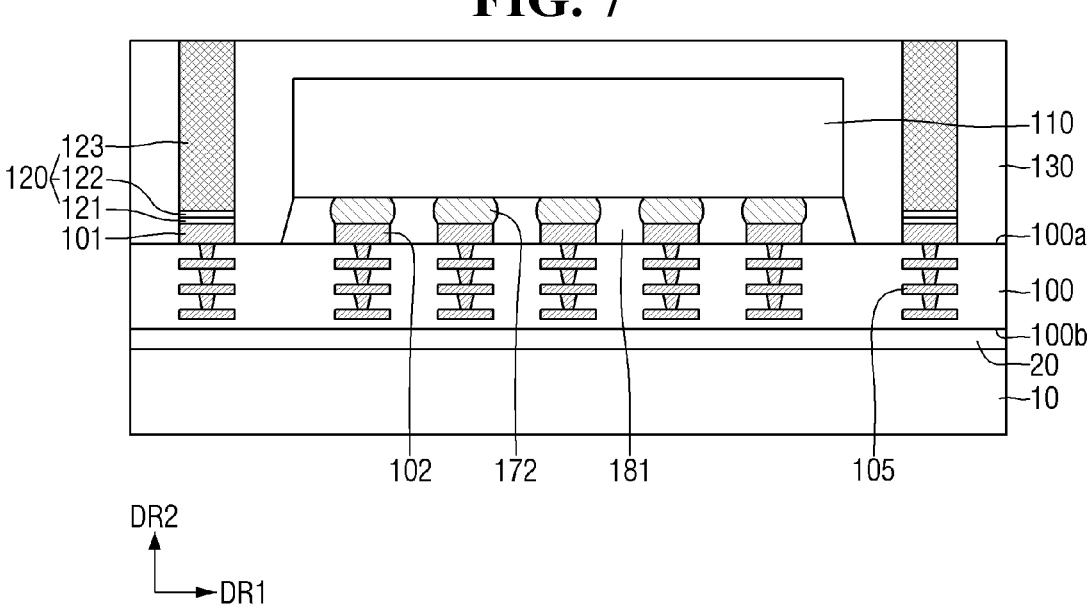

Referring to FIG. 7, the first mold layer 130 may be formed on the upper surface 100a of the substrate 100. The first mold layer 130 may surround each of side walls and an upper surface of the first semiconductor chip 110, side walls of the first underfill material 181, side walls of the first conductive pad 101, and side walls and an upper surface of the connecting portion 120. A part of the upper part of the first mold layer 130 may be etched through a flattening process. As a result, the upper surface of the connecting portion 120 may be exposed. The upper surface of the connecting portion 120 may be formed on the same plane as the upper surface of the first mold layer 130.

Figure 8:
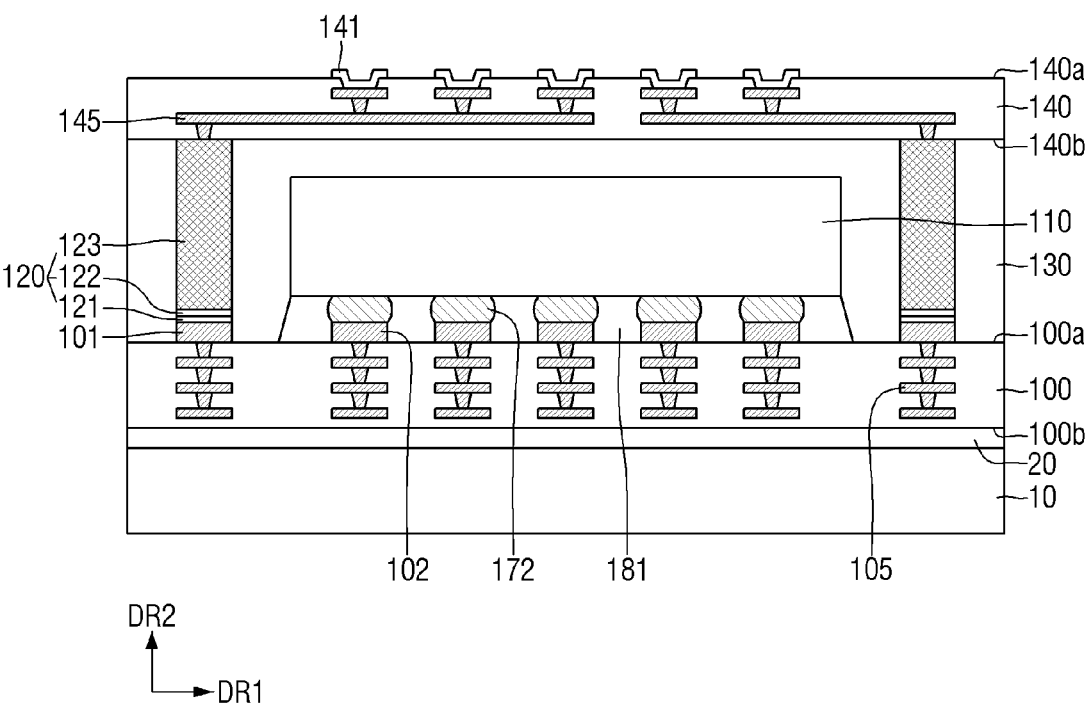

Referring to FIG. 8, the interposer 140 may be formed on the upper surface of the connecting portion 120 and the upper surface of the first mold layer 130. A lower surface 140b of the interposer 140 may be attached to each of the upper surface of the connecting portion 120 and the upper surface of the first mold layer 130. The second wiring pattern 145 may be formed inside the interposer 140. The second wiring pattern 145 may be formed to be in contact with the upper surface of the connecting portion 120. The conductive terminal 141 may be formed on the upper surface 140a of the interposer 140.

Figure 9:
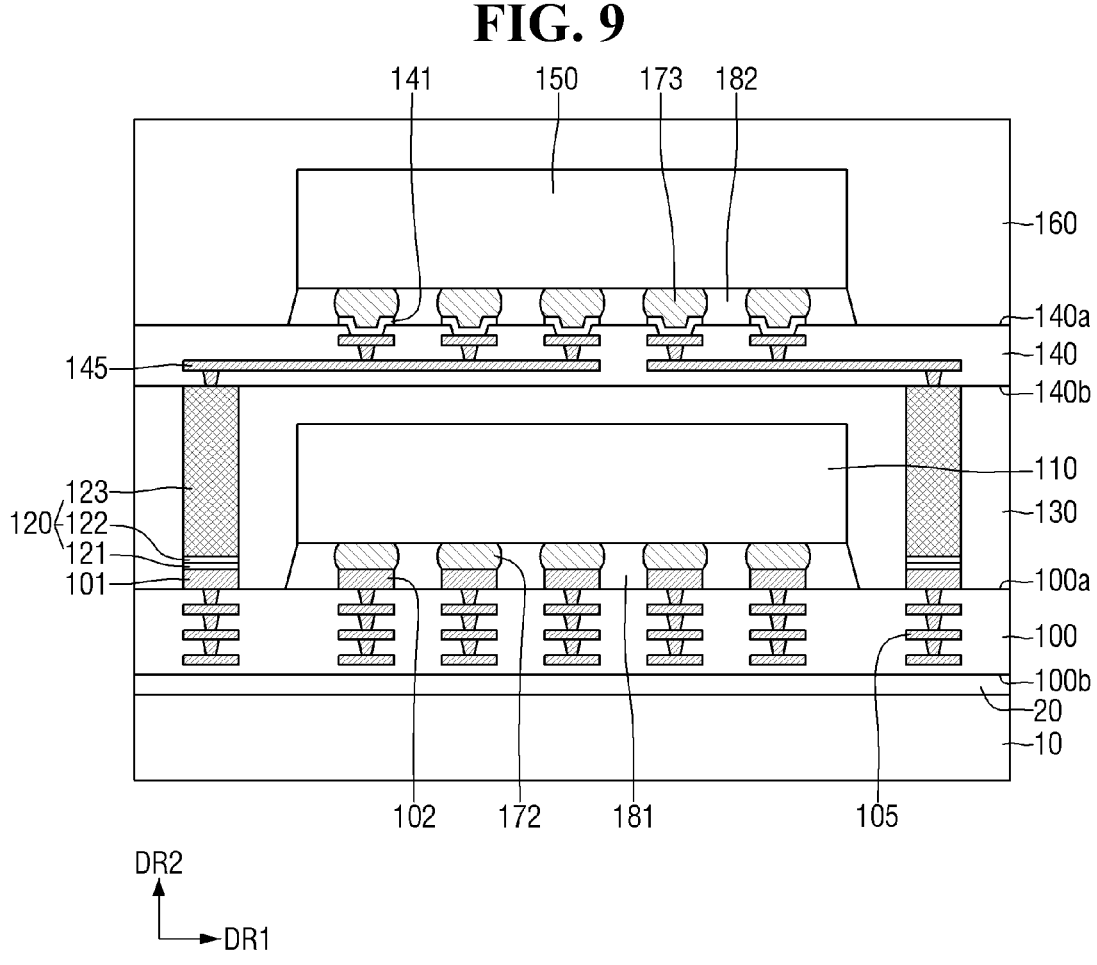

Referring to FIG. 9, the second semiconductor chip 150 may be formed on the upper surface 140a of the interposer 140. The second semiconductor chip 150 may be attached to the conductive terminal 141 through the third solder ball 173. The second underfill material 182 may be formed to surround the side walls of the third solder ball 173 and the side walls of the conductive terminal 141, between the upper surface 140a of the interposer 140 and the second semiconductor chip 150. The second mold layer 160 may be formed on the upper surface 140a of the interposer 140. The second mold layer 160 may surround the side walls and the upper surface of the second semiconductor chip 150 and the side walls of the second underfill material 182.

Figure 10:
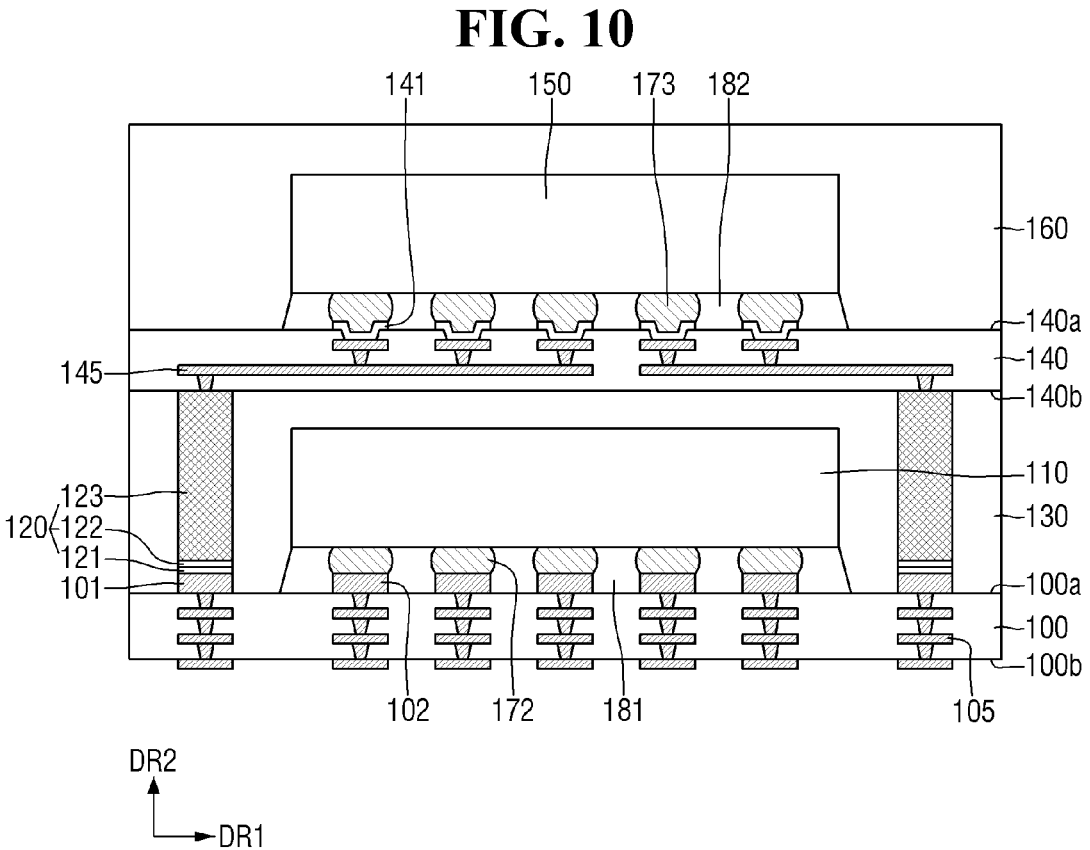

Referring to FIG. 10, the carrier substrate 10 and the release layer 20 may be removed. An etching process may be performed on the lower surface 100b of the substrate 100 to expose a part of the first wiring pattern 105 on the lower surface 100b of the substrate 100.

Referring to FIG. 1, the first solder ball 171 may be attached to the first wiring pattern 105 exposed on the lower surface 100b of the substrate 100. The semiconductor package shown in FIG. 1 may be fabricated through such a fabricating process.

In the semiconductor package according to some example embodiments, the substrate 100 and the interposer 140 may be electrically connected through the connecting portion 120 which includes the first metal layer 121 including a metal having a relatively low melting point, a second metal layer 122 including a metal for preventing the diffusion of other metals, and the metal post 123. Such a structure may be fabricated, by fabricating the connecting portion 120 including the first metal layer 121, the second metal layer 122 and the metal post 123 in advance, and attaching the connecting portion 120 to the first conductive pad 101 disposed on the upper surface 100a of the substrate 100. This makes it possible to simplify the fabricating process for forming the connecting portion 120.

Hereinafter, a semiconductor package according to some other example embodiments will be described referring to FIGS. 11 and 12. Differences from the semiconductor package shown in FIGS. 1 and 2 will be mainly described.

Figure 11:
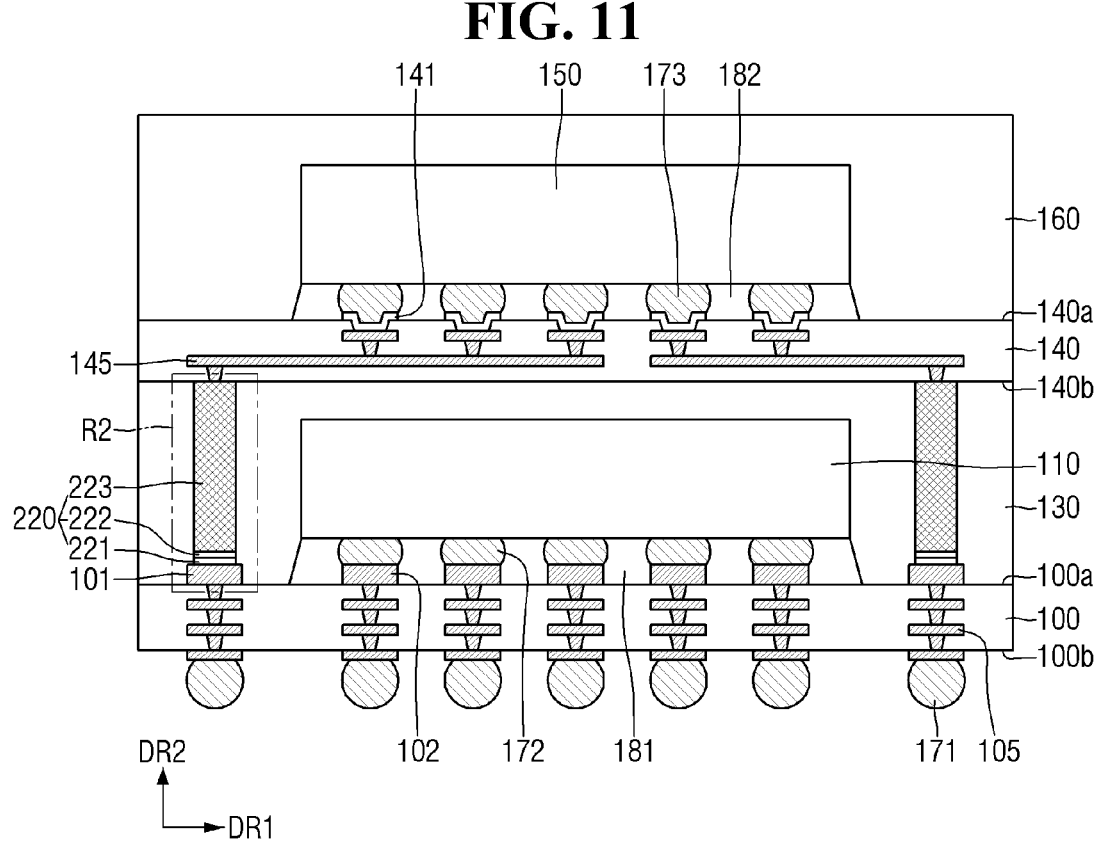
FIG. 11 is a diagram for explaining a semiconductor package according to some other example embodiments.

FIG. 11 is a diagram for explaining a semiconductor package according to some other example embodiments. FIG. 12 is an enlarged view of a region R2 of FIG. 11.

Figure 12:
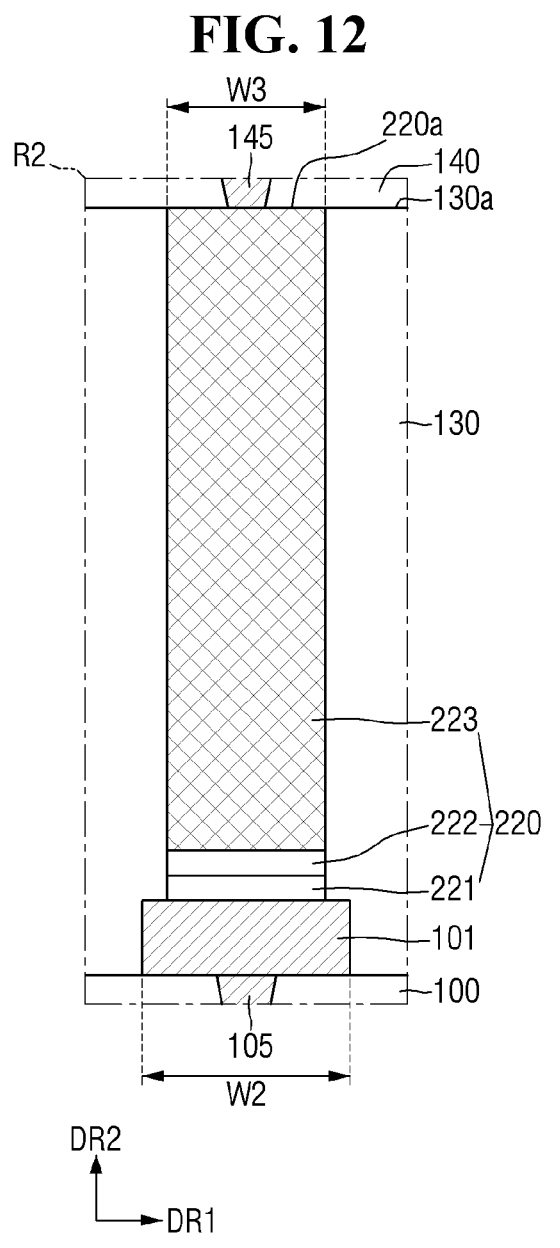

Referring to FIGS. 11 and 12, in the semiconductor package according to some other example embodiments, a width W3 of the connecting portion 220 in the horizontal direction DR1 may be formed to be smaller than the width W2 of the first conductive pad 101 in the horizontal direction DR1.

The widths W3 in the horizontal direction DR1 of each of the first metal layer 221, the second metal layer 222, and the metal post 223 may be formed to be equal to each other. An upper surface 220a of the connecting portion 220 may be formed on the same plane as the upper surface 130a of the first mold layer 130. That is, the upper surface of the metal post 223 may be formed on the same plane as the upper surface 130a of the first mold layer 130.

Hereinafter, a semiconductor package according to some other example embodiments will be described referring to FIGS. 13 and 14. Differences from the semiconductor packages shown in FIGS. 1 and 2 will be mainly described.

Figure 13:
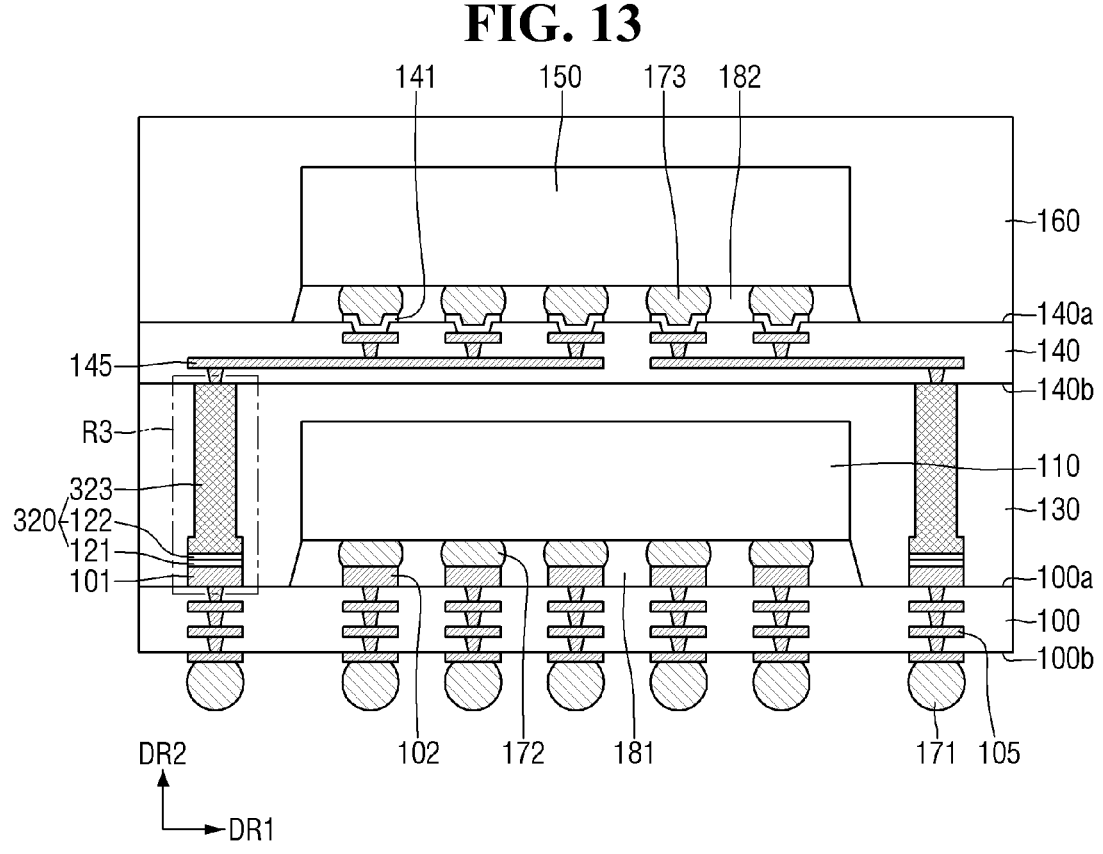
FIG. 13 is a diagram for explaining a semiconductor package according to still some other example embodiments.

FIG. 13 is a diagram for explaining a semiconductor package according to still some other example embodiments. FIG. 14 is an enlarged view of a region R3 of FIG. 13.

Figure 14:
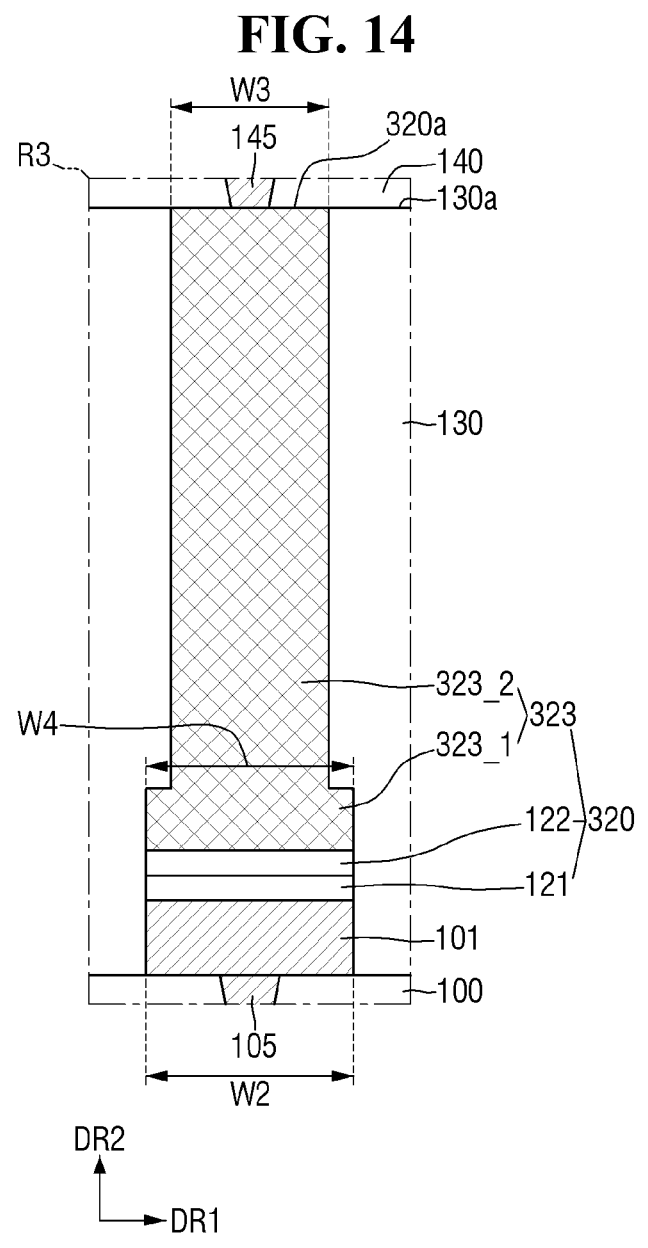

Referring to FIGS. 13 and 14, in the semiconductor package according to still some other example embodiments, a metal post 323 may include a first portion 323_1 and a second portion 323_2 having widths in the horizontal direction DR1 different from each other.

The first portion 323_1 of the metal post 323 may be disposed on the upper surface of the second metal layer 122. The first portion 323_1 of the metal post 323 may be in contact with the upper surface of the second metal layer 122. A width W4 of the first portion 323_1 of the metal post 323 in the horizontal direction DR1 may be the same as the width W2 in the horizontal direction DR1 of each of the first conductive pad 101, the first metal layer 121, and the second metal layer 122.

The second portion 323_2 of the metal post 323 may be disposed on the first portion 323_1 of the metal post 323. The second portion 323_2 of the metal post 323 may extend from the first portion 323_1 in the vertical direction DR2. The width W3 of the second portion 323_2 of the metal post 323 in the horizontal direction DR1 may be smaller than the width W4 of the first portion 323_1 of the metal post 323 in the horizontal direction DR1.

An upper surface 320a of a connecting portion 320 may be formed on the same plane as the upper surface 130a of the first mold layer 130. That is, the upper surface of the second portion 323_2 of the metal post 323 may be formed on the same plane as the upper surface 130a of the first mold layer 130.

Hereinafter, a semiconductor packages according to some other example embodiments will be described referring to FIGS. 15 and 16. Differences from the semiconductor packages shown in FIGS. 1 and 2 will be mainly described.

Figure 15:
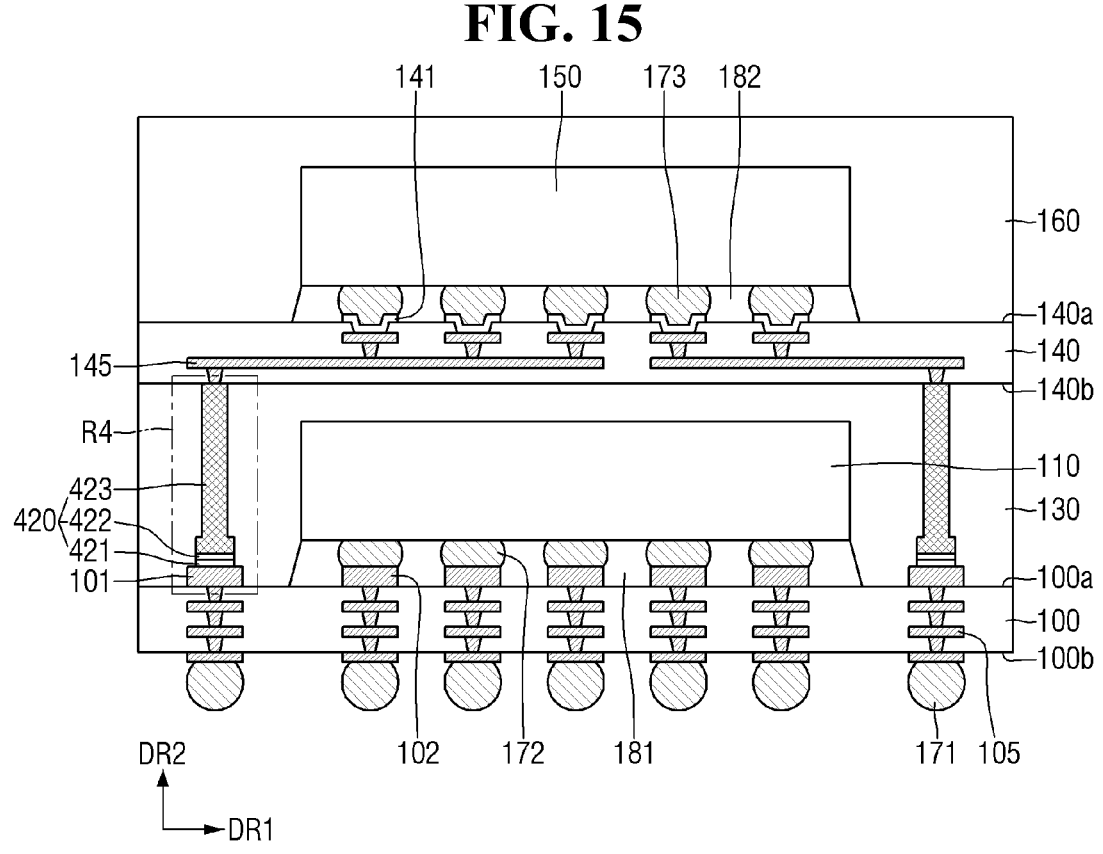
FIG. 15 is a diagram for explaining a semiconductor package according to still some other example embodiments.

FIG. 15 is a diagram for explaining a semiconductor package according to still some other example embodiments. FIG. 16 is an enlarged view of a region R4 of FIG. 15.

Figure 16:
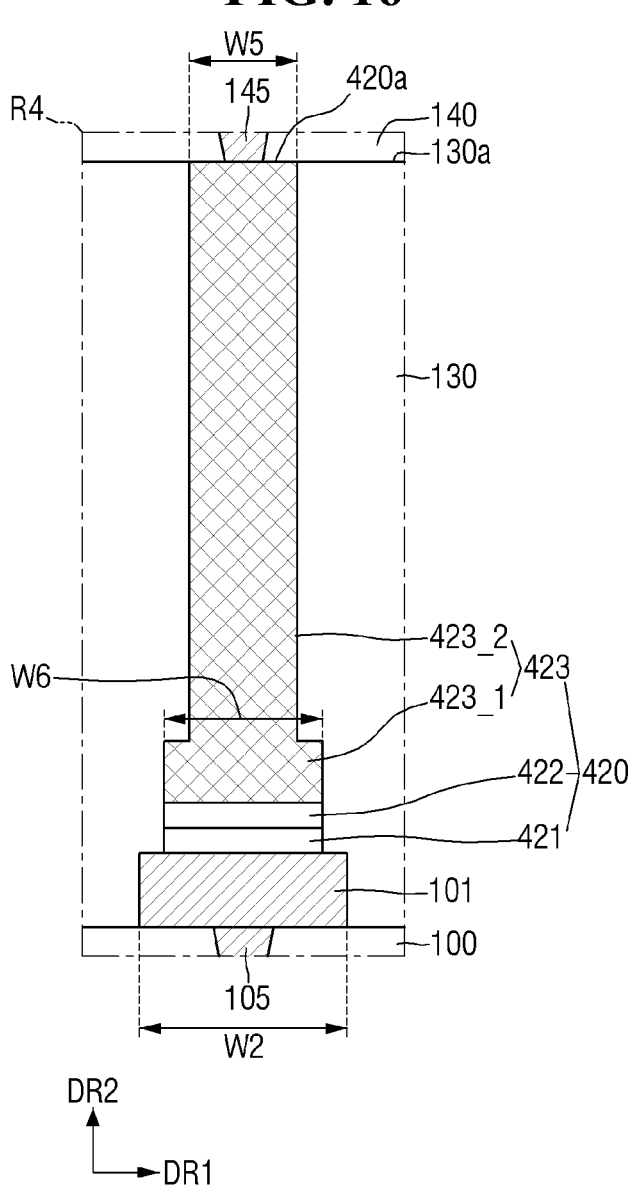
FIG. 16 is an enlarged view of a region R4 of FIG. 15.

Referring to FIGS. 15 and 16, in the semiconductor package according to still some other example embodiments, a width of a connecting portion 420 in the horizontal direction DR1 may be formed to be smaller than the width W2 of the first conductive pad 101 in the horizontal direction DR1. Further, a metal post 423 may include a first portion 423_1 and a second portion 423_2 having widths in the horizontal direction DR1 different from each other.

The width of each of the first metal layer 421 and the second metal layer 422 in the horizontal direction DR1 may be smaller than the width W2 of the first conductive pad 101 in the horizontal direction DR1. A width W6 of the first portion 423_1 of the metal post 423 in the horizontal direction DR1 may be the same as the width of each of the first metal layer 421 and the second metal layer 422 in the horizontal direction DR1. A width W5 of the second portion 423_2 of the metal post 423 in the horizontal direction DR1 may be smaller than the width W6 of the first portion 423_1 of the metal post 423 in the horizontal direction DR1.

An upper surface 420a of the connecting portion 420 may be formed on the same plane as the upper surface 130a of the first mold layer 130. That is, the upper surface of the second portion 423_2 of the metal post 423 may be formed on the same plane as the upper surface 130a of the first mold layer 130.

Hereinafter, a semiconductor package according to some other example embodiments will be described referring to FIGS. 17 and 18. Differences from the semiconductor package shown in FIGS. 1 and 2 will be mainly described.

Figure 17:
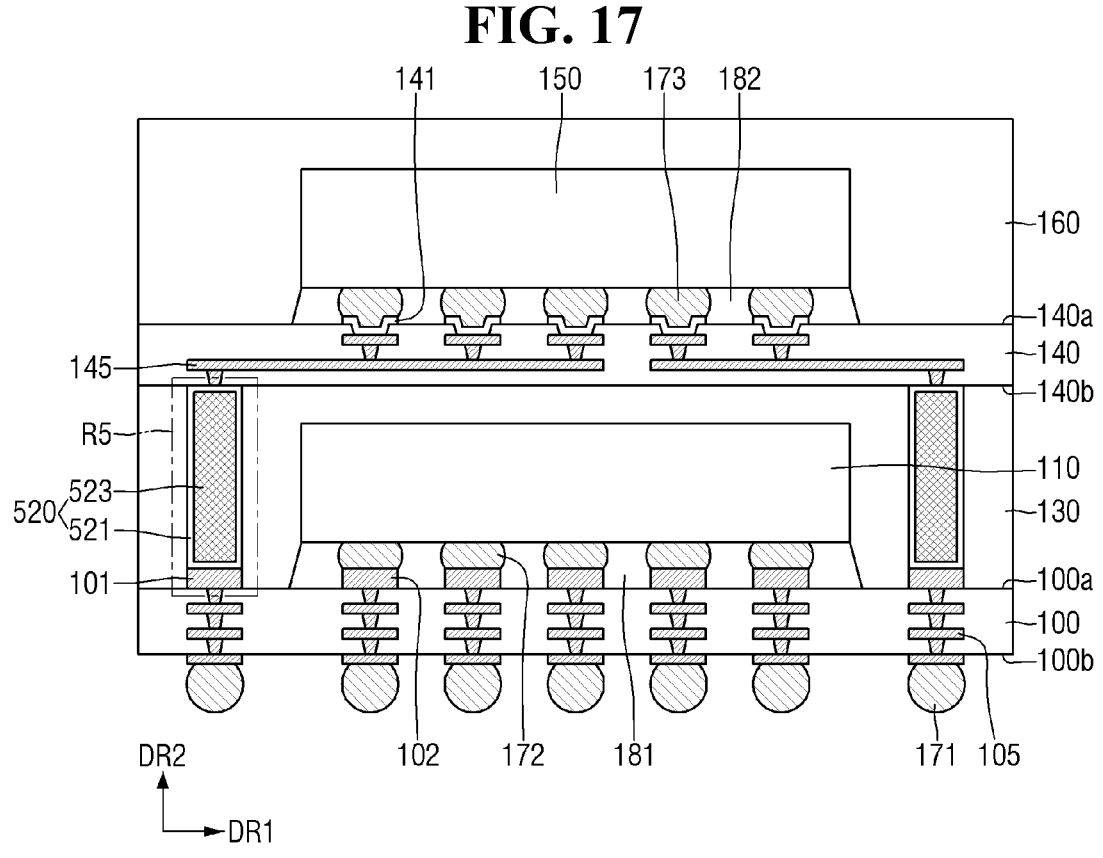
FIG. 17 is a diagram for explaining a semiconductor package according to still some other example embodiments.

FIG. 17 is a diagram for explaining a semiconductor package according to still some other example embodiments. FIG. 18 is an enlarged view of a region R5 of FIG. 17.

Figure 18:
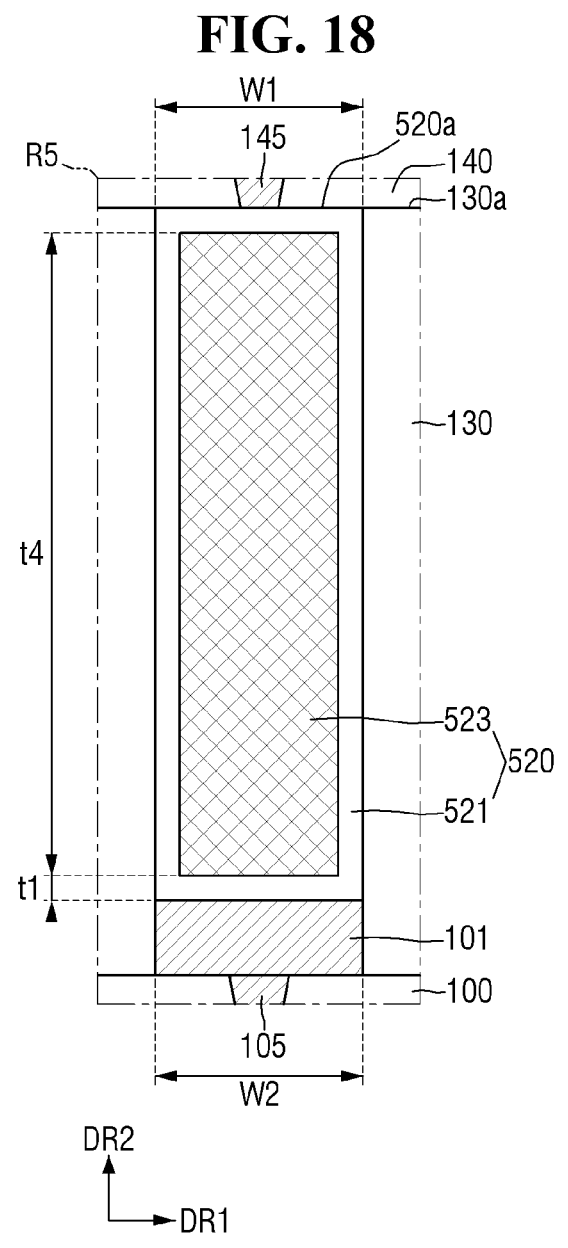

Referring to FIGS. 17 and 18, in a semiconductor package according to still some other example embodiments, a connecting portion 520 may include a first metal layer 521 and a metal post 523.

The metal post 523 may be disposed on the upper surface of the first conductive pad 101. The first metal layer 521 may completely surround the surface of the metal post 523. Specifically, the first metal layer 521 may be disposed on a lower surface of the metal post 523, side walls of the metal post 523, and an upper surface of the metal post 523. The first metal layer 521 may be in contact with the surface of the metal post 523. The first metal layer 521 may be in contact with the upper surface of the first conductive pad 101 on the lower surface of the metal post 523.

A width W1 of a connecting portion 520 in the horizontal direction DR1 may be the same as the width W2 of the first conductive pad 101 in the horizontal direction DR1. That is, the width W1 in the horizontal direction DR1 between both side walls of the first metal layer 521 being in contact with the first mold layer 130 may be the same as the width W2 of the first conductive pad 101 in the horizontal direction DR1. For example, both side walls of the first metal layer 521 that are in contact with the first mold layer 130 may be aligned with both side walls in the horizontal direction DR1 of the first conductive pad 101 in the vertical direction DR2. However, example embodiments are not limited thereto.

For example, the first metal layer 521 may be formed to have a uniform thickness t1. A thickness t4 of the metal post 523 in the vertical direction DR2 may be greater than the thickness t1 of the first metal layer 521. The first metal layer 521 and the metal post 523 may include different metals from each other. For example, the first metal layer 521 may include tin (Sn), and the metal post 523 may include at least one of copper (Cu), silver (Ag) and gold (Au).

An upper surface 520a of the connecting portion 520 may be formed on the same plane as the upper surface 130a of the first mold layer 130. That is, the uppermost surface of the first metal layer 521 may be formed on the same plane as the upper surface 130*a* of the first mold layer 130.

Hereinafter, a semiconductor package according to some other example embodiments will be described referring to FIGS. 19 and 20. Differences from the semiconductor package shown in FIGS. 1 and 2 will be mainly described.

Figure 19:
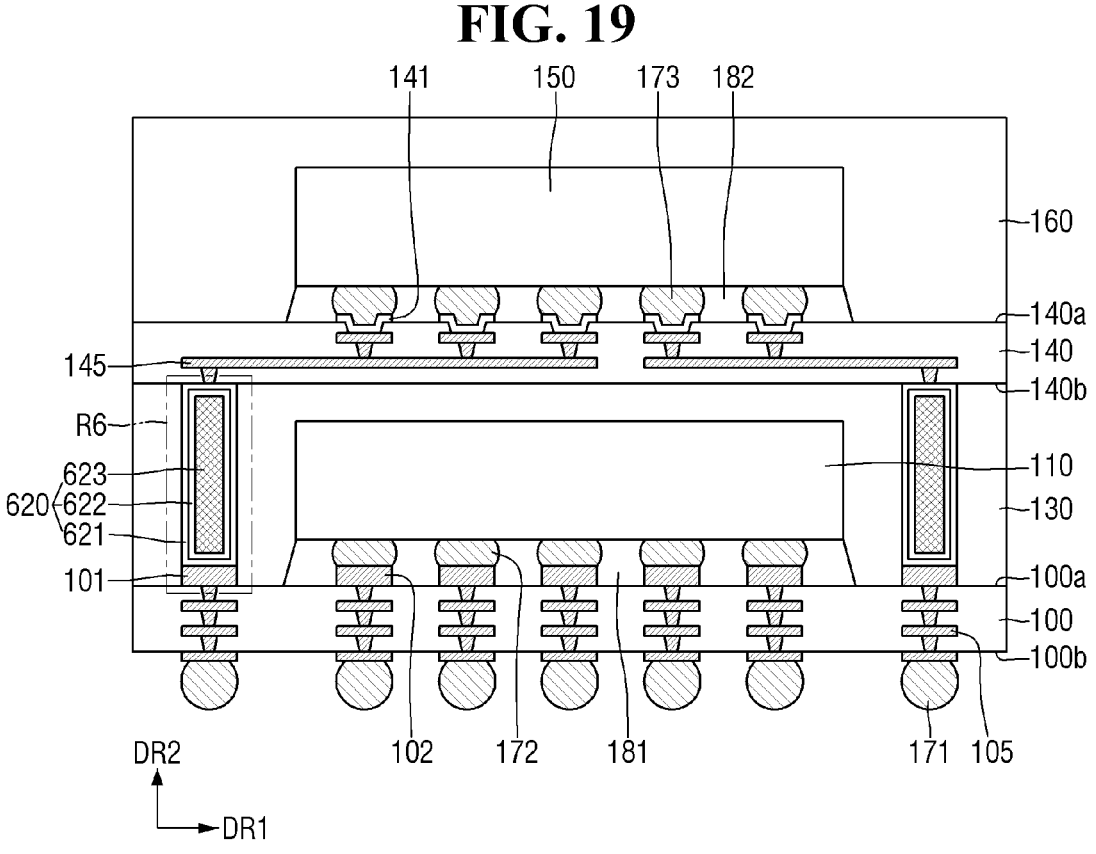
FIG. 19 is a diagram for explaining a semiconductor package according to still some other example embodiments.

FIG. 19 is a diagram for explaining a semiconductor package according to still some other example embodiments. FIG. 20 is an enlarged view of a region R6 of FIG. 19.

Figure 20:
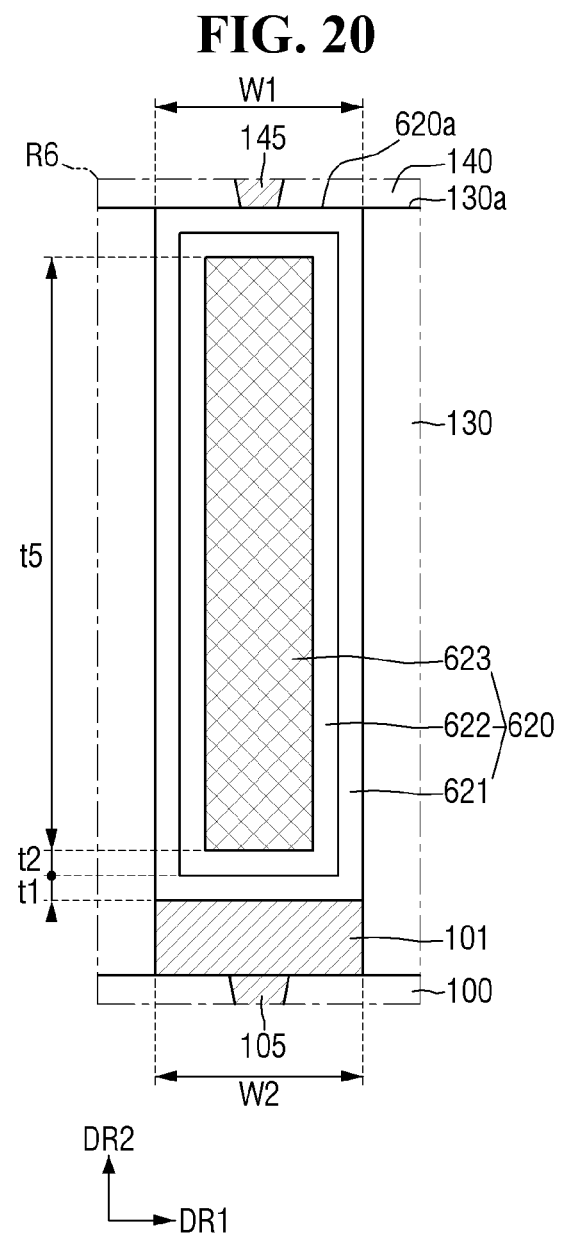

Referring to FIGS. 19 and 20, in a semiconductor package according to some other example embodiment, a connecting portion 620 may include a first metal layer 621, a second metal layer 622, and a metal post 623.

The metal post 623 may be disposed on the upper surface of the first conductive pad 101. The first metal layer 621 may completely surround the surface of the metal post 623. Specifically, the first metal layer 621 may be disposed on a lower surface of the metal post 623, side walls of the metal post 623, and an upper surface of the metal post 623. The first metal layer 621 may be in contact with the upper surface of the first conductive pad 101 on the lower surface of the metal post 623.

The second metal layer 622 may be disposed between the first metal layer 621 and the metal post 623. The second metal layer 622 may completely surround the surface of the metal post 623. The second metal layer 622 may be in contact with the surface of the metal post 623. The second metal layer 622 may be in contact with the first metal layer 621.

A width W1 of the connecting portion 620 in the horizontal direction DR1 may be the same as the width W2 of the first conductive pad 101 in the horizontal direction DR1. That is, the width W1 in the horizontal direction DR1 between both side walls of the first metal layer 621 being in contact with the first mold layer 130 may be the same as the width W2 of the first conductive pad 101 in the horizontal direction DR1. For example, both side walls of the first metal layer 621 that are in contact with the first mold layer 130 may be aligned with both side walls in the horizontal direction DR1 of the first conductive pad 101 in the vertical direction DR2. However, example embodiments are not limited thereto.

For example, the first metal layer 621 may be formed to have a uniform thickness t1. Further, the second metal layer 622 may be formed to have a uniform thickness t2. The thickness t5 of the metal post 623 in the vertical direction DR2 may be greater than each of the thickness t1 of the first metal layer 621 and the thickness t2 of the second metal layer 622. The first metal layer 621, the second metal layer 622, and the metal post 623 may include different metals from each other. For example, the first metal layer 621 may include tin (Sn), the second metal layer 622 may include nickel (Ni), and the metal post 623 may include at least one of copper (Cu), silver (Ag), and gold (Au).

An upper surface 620*a* of the connecting portion 620 may be formed on the same plane as the upper surface 130*a* of the first mold layer 130. That is, the uppermost surface of the first metal layer 621 may be formed on the same plane as the upper surface 130*a* of the first mold layer 130.

Hereinafter, a semiconductor package according to some other example embodiments will be described referring to FIGS. 21 and 22. Differences from the semiconductor package shown in FIGS. 1 and 2 will be mainly described.

Figure 21:
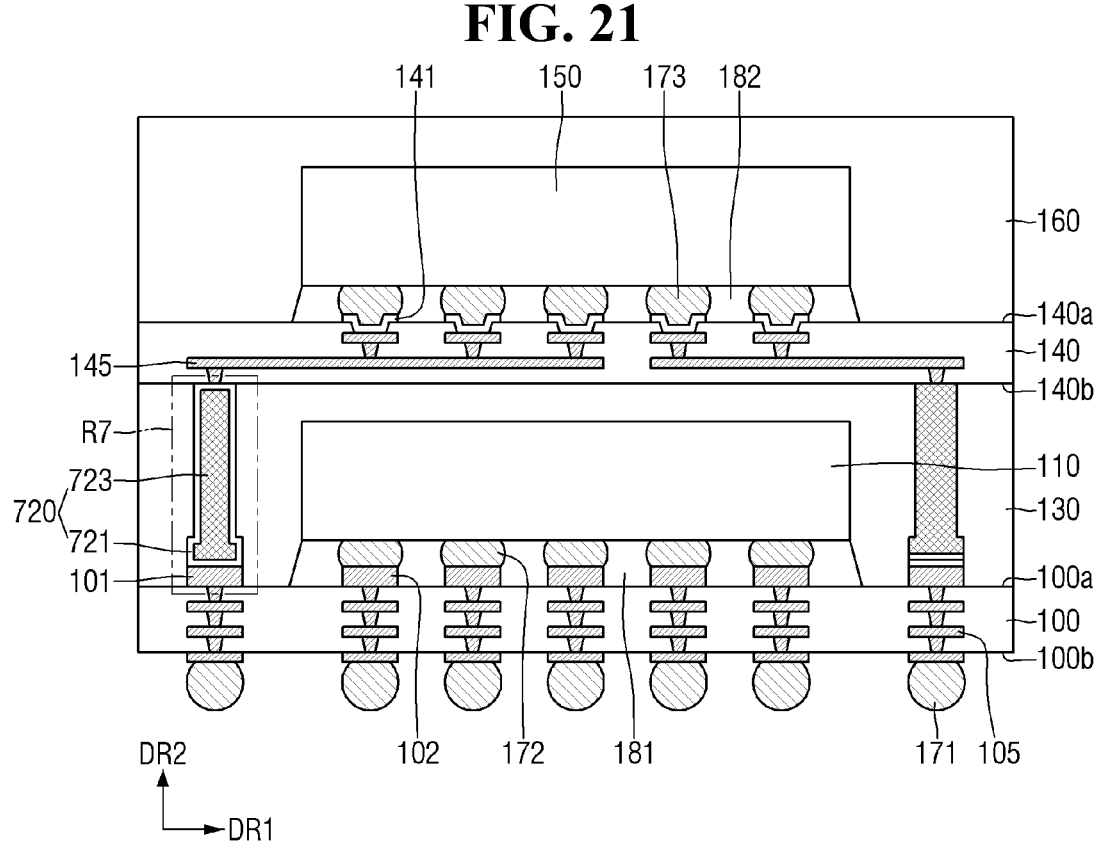
FIG. 21 is a diagram for explaining a semiconductor package according to still some other example embodiments.

FIG. 21 is a diagram for explaining a semiconductor package according to still some other example embodiments. FIG. 22 is an enlarged view of a region R7 of FIG. 21.

Figure 22:
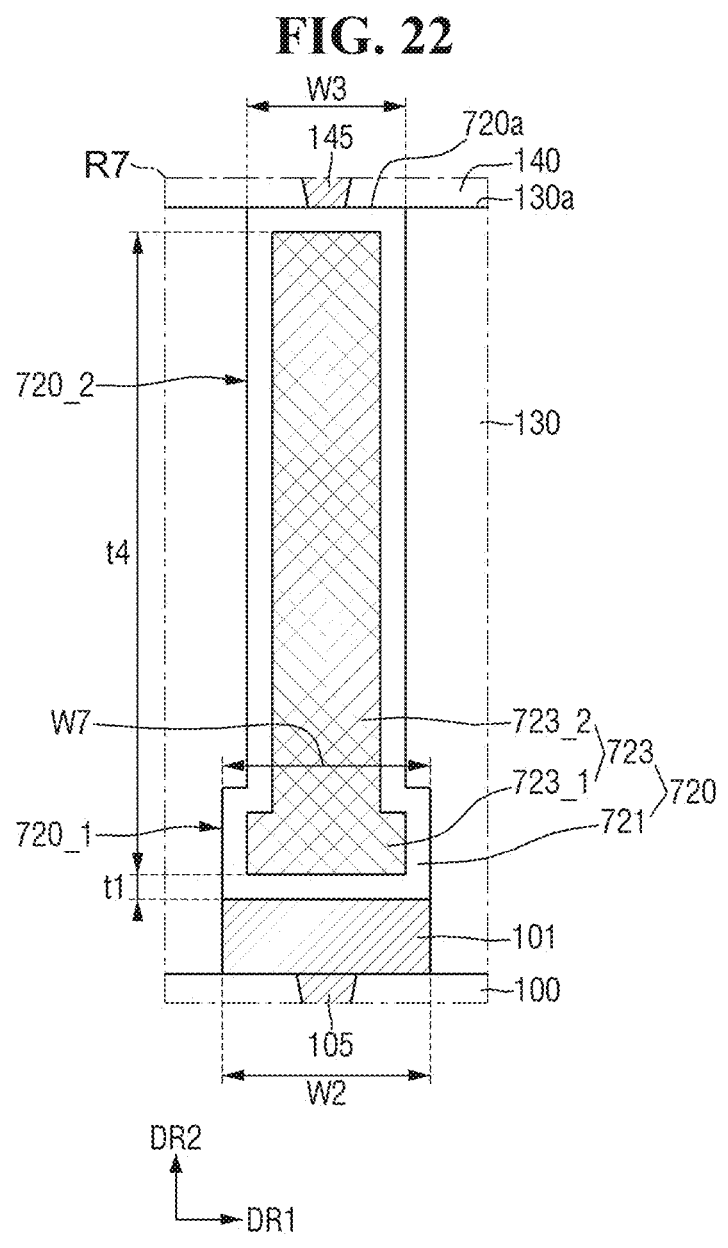

Referring to FIGS. 21 and 22, in a semiconductor package according to some other example embodiment, a connecting portion 720 may include a first metal layer 721 and a metal post 723.

The connecting portion 720 may include a first portion 720_1 that is in contact with the first conductive pad 101, and a second portion 720_2 disposed on the first portion 720_1. A width W7 of the first portion 720_1 of the connecting portion 720 in the horizontal direction DR1 may be greater than a width W3 of the second portion 720_2 of the connecting portion 720 in the horizontal direction DR1. The metal post 723 may be disposed on the upper surface of the first conductive pad 101. The metal post 723 may include a first portion 723_1 and a second portion 723_2 having widths in the horizontal direction DR1 different from each other.

The first portion 723_1 of the metal post 723 may be disposed on the upper surface of the first conductive pad 101. A width of the first portion 723_1 of the metal post 723 in the horizontal direction DR1 may be smaller than the width W2 of the first conductive pad 101 in the horizontal direction DR1. The second portion 723_2 of the metal post 723 may be disposed on the first portion 723_1 of the metal post 723. The second portion 723_2 of the metal post 723 may extend from the first portion 723_1 in the vertical direction DR2. The width of the second portion 723_2 of the metal post 723 in the horizontal direction DR1 may be smaller than the width of the first portion 723_1 of the metal post 723 in the horizontal direction DR1.

The first metal layer 721 may completely surround the surface of the metal post 723. Specifically, the first metal layer 721 may be disposed on a lower surface of the metal post 723, side walls of the metal post 723, and an upper surface of the metal post 723. The first metal layer 721 may be in contact with the surface of the metal post 723. The first metal layer 721 may be in contact with the upper surface of the first conductive pad 101 on the lower surface of the metal post 723.

A width W7 of the first portion 720_1 of the connecting portion 720 in the horizontal direction DR1 may be the same as the width W2 of the first conductive pad 101 in the horizontal direction DR1. For example, the first metal layer 721 may be formed to have a uniform thickness t1. The thickness t4 of the metal post 723 in the vertical direction DR2 may be greater than the thickness t1 of the first metal layer 721. The first metal layer 721 and the metal post 723 may include different metals from each other. For example, the first metal layer 721 may include tin (Sn), and the metal post 723 may include at least one of copper (Cu), silver (Ag) and gold (Au).

An upper surface 720*a* of the connecting portion 720 may be formed on the same plane as the upper surface 130*a* of the first mold layer 130. That is, the uppermost surface of the first metal layer 721 may be formed on the same plane as the upper surface 130*a* of the first mold layer 130.

Hereinafter, a semiconductor package according to some other example embodiments will be described referring to FIGS. 23 and 24. Differences from the semiconductor package shown in FIGS. 1 and 2 will be mainly described.

Figure 23:
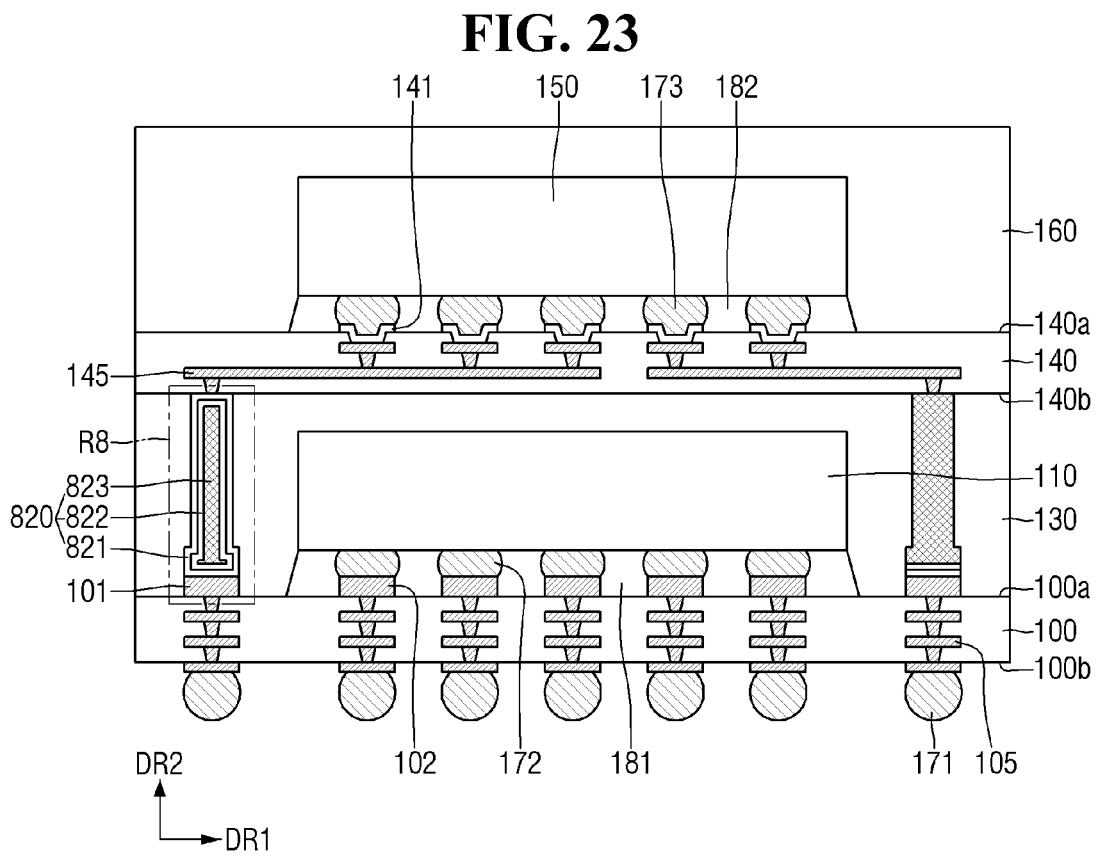
FIG. 23 is a diagram for explaining a semiconductor package according to still some other example embodiments.

FIG. 23 is a diagram for explaining a semiconductor package according to still some other example embodiments. FIG. 24 is an enlarged view of a region R8 of FIG. 23.

Figure 24:
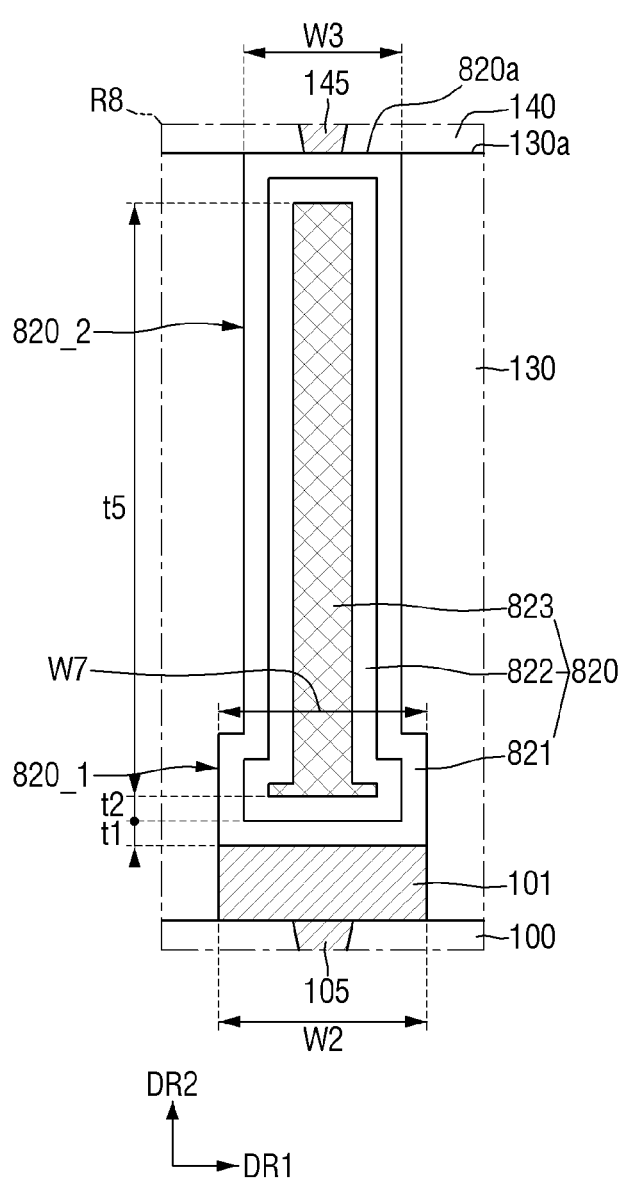
FIG. 24 is an enlarged view of a region R8 of FIG. 23.

Referring to FIGS. 23 and 24, in a semiconductor package according to some other example embodiment, a connecting portion 820 may include a first metal layer 821, a second metal layer 822, and a metal post 823.

The connecting portion 820 may include a first portion 820_1 that is in contact with the first conductive pad 101, and a second portion 820_2 disposed on the first portion 820_1. A width W7 of the first portion 820_1 of the connecting portion 820 in the horizontal direction DR1 may be greater than a width W3 of the second portion 820_2 of the connecting portion 820 in the horizontal direction DR1. The metal post 823 may be disposed on the upper surface of the first conductive pad 101. The metal post 823 may include a first portion and a second portion having different widths from each other in the horizontal direction DR1.

The first portion of the metal post 823 may be disposed on the upper surface of the first conductive pad 101. The width of the first portion of the metal post 823 in the horizontal direction DR1 may be smaller than the width W2 of the first conductive pad 101 in the horizontal direction DR1. The second portion of the metal post 823 may be disposed on the first portion of the metal post 823. The second portion of the metal post 823 may extend from the first portion in the vertical direction DR2. The width of the second portion of the metal post 823 in the horizontal direction DR1 may be smaller than the width of the first portion of the metal post 823 in the horizontal direction DR1.

The first metal layer 821 may completely surround the surface of the metal post 823. Specifically, the first metal layer 821 may be disposed on a lower surface of the metal post 823, side walls of the metal post 823, and an upper surface of the metal post 823. The first metal layer 821 may be in contact with the upper surface of the first conductive pad 101 on the lower surface of the metal post 823.

The second metal layer 822 may be disposed between the first metal layer 821 and the metal post 823. The second metal layer 822 may completely surround the surface of the metal post 823. The second metal layer 822 may be in contact with the surface of the metal post 823. The second metal layer 822 may be in contact with the first metal layer 821.

A width W7 of the first portion 820_1 of the connecting portion 820 in the horizontal direction DR1 may be the same as the width W2 of the first conductive pad 101 in the horizontal direction DR1. For example, the first metal layer 821 may be formed to have a uniform thickness t1. Further, the second metal layer 822 may be formed to have a uniform thickness t2. A thickness t5 of the metal post 823 in the vertical direction DR2 may be greater than each of the thickness t1 of the first metal layer 821 and the thickness t2 of the second metal layer 822. The first metal layer 821, the second metal layer 822, and the metal post 823 may include different metals from each other. For example, the first metal layer 821 may include tin (Sn), the second metal layer 822 may include nickel (Ni), and the metal post 823 may include at least one of copper (Cu), silver (Ag), and gold (Au).

An upper surface 820a of the connecting portion 820 may be formed on the same plane as the upper surface 130a of the first mold layer 130. That is, the uppermost surface of the first metal layer 821 may be formed on the same plane as the upper surface 130a of the first mold layer 130.

While aspects of example embodiments have been particularly shown and described, it will be understood that various changes in form and details may be made therein without departing from the spirit and scope of the following claims.

What is claimed is:

1. A semiconductor package comprising:
a substrate;
a first semiconductor chip provided on an upper surface of the substrate;
an interposer provided on the first semiconductor chip;
a conductive pad provided on the upper surface of the substrate;
a connecting portion provided between the upper surface of the substrate and a lower surface of the interposer, wherein the connecting portion is spaced apart from the first semiconductor chip along a horizontal direction parallel to the upper surface of the substrate and electrically connects the conductive pad and the interposer, and the connecting portion comprises a first metal layer provided on the conductive pad, a second metal layer provided on the first metal layer, and a metal post provided on the second metal layer; and
a mold layer which surrounds each of the conductive pad, the first metal layer, the second metal layer, the metal post and the first semiconductor chip between the upper surface of the substrate and the lower surface of the interposer,
wherein a width of the first metal layer in the horizontal direction, a width of the second metal layer in the horizontal direction, and a width of the metal post in the horizontal direction are equal to each other,
wherein a thickness of the mold layer in a vertical direction perpendicular to the upper surface of the substrate corresponds to combined thicknesses of the conductive pad, the first metal layer, the second metal layer and the metal post,
wherein the first metal layer has a uniform thickness along the vertical direction and extends along an upper surface of the conductive pad to an edge of the conductive pad,
wherein the second metal layer extends along an upper surface of the first metal layer to an edge of the first metal layer, and
wherein the first metal layer comprises a first metal, the second metal layer comprises a second metal different from the first metal, and the metal post comprises a third metal different from the first metal and the second metal.

2. The semiconductor package of claim 1, wherein the first metal comprises tin (Sn), and the second metal comprises nickel (Ni).

3. The semiconductor package of claim 1, wherein an upper surface of the second metal layer is closer to the substrate than an upper surface of the first semiconductor chip.

4. The semiconductor package of claim 1, wherein the metal post comprises a first portion provided on the second metal layer, and a second portion provided on the first portion,
wherein a width of the first portion of the metal post in the horizontal direction is greater than a width of the second portion of the metal post in the horizontal direction, and
wherein the width of the first metal layer is the same as the width of the first portion of the metal post.

5. The semiconductor package of claim 4, wherein the width of the first portion of the metal post in the horizontal direction is the same as the width of the second metal layer in the horizontal direction.

6. The semiconductor package of claim 1, further comprising:

a second semiconductor chip provided on an upper surface of the interposer.

7. The semiconductor package of claim 6, wherein an upper surface of the mold layer and an upper surface of the connecting portion extend along a common plane.

8. The semiconductor package of claim 6, wherein the mold layer surrounds the conductive pad and extends along a side wall of the conductive pad to a bottom surface of the conductive pad.

9. The semiconductor package of claim 8, wherein the mold layer comprises an epoxy molding compound.

10. The semiconductor package of claim 1, wherein the metal post is taller in the vertical direction perpendicular to the upper surface of the substrate than each of the first metal layer and the second metal layer.

11. A semiconductor package comprising:

a substrate;

a first semiconductor chip provided on an upper surface of the substrate;

a conductive pad provided on the upper surface of the substrate;

a first metal layer provided on an upper surface of the conductive pad and comprising tin (Sn), the first metal layer having a uniform thickness along a vertical direction perpendicular to the upper surface of the substrate, and extending along the upper surface of the conductive pad to an edge of the conductive pad;

a second metal layer provided on an upper surface of the first metal layer and comprising nickel (Ni), the second metal layer extending along the upper surface of the first metal layer to an edge of the first metal layer;

a metal post provided on an upper surface of the second metal layer, wherein the metal post extends in the vertical direction perpendicular to the upper surface of the substrate, comprises copper (Cu), and has an upper surface farther from the upper surface of the substrate than an upper surface of the first semiconductor chip; and a mold layer which surrounds side walls of each of the conductive pad, the first metal layer, the second metal layer and the metal post, and side walls and the upper surface of the first semiconductor chip, wherein an upper surface of the mold layer and the upper surface of the metal post extend along a common plane, wherein a thickness of the mold layer in the vertical direction corresponds to a combination of a thickness of the conductive pad, a thickness of the first metal layer, a thickness of the second metal layer and a thickness of the metal post, and wherein a width of the first metal layer in a horizontal direction, a width of the second metal layer in the horizontal direction, and a width of the metal post in the horizontal direction are equal to each other.

12. The semiconductor package of claim 11, wherein the mold layer surrounds the conductive pad and extends along a side wall of the conductive pad to a bottom surface of the conductive pad.

13. The semiconductor package of claim 12, wherein the mold layer comprises an epoxy molding compound.

* * * * *